United States Patent [19]
Maeda

[11] Patent Number: 6,084,822
[45] Date of Patent: Jul. 4, 2000

[54] SEMICONDUCTOR SYNCHRONOUS MEMORY DEVICE RESPONSIVE TO EXTERNAL MASKING SIGNAL FOR FORCING DATA PORT TO ENTER INTO HIGH-IMPEDANCE STATE AND METHOD FOR CONTROLLING THE SAME

[75] Inventor: Kazunori Maeda, Tokyo, Japan

[73] Assignee: NEC Corporation, Tokyo, Japan

[21] Appl. No.: 09/288,785

[22] Filed: Apr. 9, 1999

[30] Foreign Application Priority Data

Apr. 13, 1998 [JP] Japan .................................. 10-101091

[51] Int. Cl.$^7$ ..................................................... G11C 8/00

[52] U.S. Cl. ............... 365/233; 365/230.08; 365/189.05; 365/226

[58] Field of Search ............................... 365/233, 189.05, 365/230.08, 191, 230.06, 226

[56] References Cited

U.S. PATENT DOCUMENTS

| | | | |
|---|---|---|---|
| 4,881,201 | 11/1989 | Sato et al. | 365/189.09 |
| 4,980,799 | 12/1990 | Tobita | 361/311 |
| 5,600,605 | 2/1997 | Schaefer | 365/233 |
| 5,703,831 | 12/1997 | Sawada | 365/233 |

*Primary Examiner*—David Nelms
*Assistant Examiner*—Thong Le
*Attorney, Agent, or Firm*—Sughrue, Mion, Zinn, Macpeak & Seas, PLLC

[57] ABSTRACT

A synchronous dynamic random access memory device is responsive to external commands so as to write a data bit into and read out the data bit from a memory cell array. When an external power source starts to supply an external power voltage to a power source, an internal power voltage starts to rise toward a constant level, and a masking signal generator produces an internal masking signal in response to an external masking signal so as to force a data port to enter high-impedance state, thereby preventing an external device from receiving an undefined data signal.

14 Claims, 9 Drawing Sheets

SEMICONDUCTOR SYNCHRONOUS MEMORY DEVICE RESPONSIVE TO EXTERNAL MASKING SIGNAL FOR FORCING DATA PORT TO ENTER INTO HIGH-IMPEDANCE STATE AND METHOD FOR CONTROLLING THE SAME

FIELD OF THE INVENTION

This invention relates to a semiconductor memory device and, more particularly, to a semiconductor synchronous memory device and a method for controlling the semiconductor synchronous memory device.

DESCRIPTION OF THE RELATED ART

Users have requested semiconductor device manufacturers to speed up semiconductor dynamic random access memory devices. One of the approaches to satisfy the user's request is to synchronize data transfer between the input/output data buffer and the memory cells with an external clock signal. This technology is applied to the semiconductor dynamic random access memory device, and the semiconductor dynamic random access memory device is called as "synchronous dynamic random access memory device".

FIG. 1 illustrates a typical example of the synchronous dynamic random access memory device. The prior art synchronous dynamic random access memory device comprises a memory cell array 1. Though not shown in FIG. 1, plural dynamic random access memory cells, word lines and bit line pairs are incorporated in the memory cell array 1, and the word lines and the bit line pairs are selectively connected to the plural memory cells. Data bits are respectively stored in the memory cells in the form of electric charge, and the word lines selectively connect the memory cells to the bit line pairs. The data bits generate potential differences on the bit line pairs.

The prior art synchronous dynamic random access memory device further comprises a row address buffer 2, a row address decoder 3, sense amplifiers 4, a column address buffer 5, a column address decoder 6, a column selector 7 and data lines 8. A refresh counter is incorporated in the row address buffer 2, and a burst counter forms a part of the column address buffer 5.

An external row address signal is supplied to the row address buffer 2, and the row address buffer 2 supplies row address predecoded signals to the row address decoder 3. The row address decoder 3 is responsive to the row address predecoded signals so as to selectively change the word lines to an active level. As a result, the memory cells are selectively connected to the bit line pairs, and generate potential differences on the bit line pairs, respectively. The potential differences are increased by the sense amplifiers 4, and reach the column selectors 7.

An external column address signal is supplied to the column address buffer 5, and the column address buffer 5 supplies column address predecoded signals to the column address decoder 6. The column address decoder 6 is responsive to the column address predecoded signals so as to cause the column selector 7 to selectively connect the bit line pairs to the data lines 8.

The prior art synchronous dynamic random access memory device further comprises a data controller 9, a latch circuit 10 and a data buffer 11. The prior art synchronous dynamic random access memory device has plural data transfer modes, and the data controller 9 transfers the data bits between the data lines and the latch circuit 10 in different manners depending upon the selected data transfer mode. The data bits are sequentially transferred between the latch circuit 10 and the data buffer 11. The data buffer 11 generates an output data signal Dout from the read-out data bits, and potential differences from an input data signal Din.

The prior art synchronous dynamic random access memory device further comprises a clock generator 12, a command decoder 13, a mode register 14, a control signal generator 15, a precharge circuit 16 and a power source 17. The precharge circuit 16 is connected to the bit lines of each pair, and balances the bit lines at a precharge level. The power source 17 is supplied with an external power voltage PW, and generates an internal power voltage from the external power voltage PW. The power source 17 distributes the internal power voltage to the memory cell array 1 and the other component circuits 2 through a power supply line Vdd. The power source 17 further generates a power-on signal PON. When an external power supply line starts to supply the external power voltage PW to the prior art synchronous dynamic random access memory device, the internal power voltage gradually rises, and reaches a predetermined level. The power source 17 generates the power-on signal PON on the way to the predetermined level, and supplies the power-on signal PON to the data buffer 11.

An external clock signal CLK and a clock enable signal CKE are supplied to the clock generator 12, and the clock generator 12 generates internal clock signals such as ICLKOE and ICLK. The internal clock signal ICLKOE is supplied to the data buffer 11, and gives a data output timing to the data buffer 11. The internal clock signal ICLK is supplied to the latch circuit 10, the command decoder 13 and the control signal generator 15. The internal clock signal ICLK gives a latch timing to the data circuit 10, a timing for decoding a command to the command decoder 13 and timings for sequentially generating internal control signals to the control signal generator 15.

External control signals CSB, RASB, CASB and WE are representative of a command to the prior art synchronous dynamic random access memory device. The combinations of potential levels represent different commands such as, for example, a command for controlling a column address, a command for controlling a row address, a command for a data write-in, a command for a data read-out and a command for specifying a data transfer mode. The external control signals CSB, RASB, CASB and WE are supplied to the command decoder 13, and the command decoder 13 interprets the command so as to generate decoded signals at the pulse rise of the internal clock signal ICLK. If the command represents a data transfer mode, the decoded signals are supplied to the mode register 14, and are stored therein. The decoded signals representative of the data transfer mode are supplied to the control signal generator 15. The command decoder 13 produces decoded signals from the command representative of other operation, and supplies the decoded signals to the control signal generator 15.

The control signal generator 15 is responsive to the decoded signals supplied from the command decoder 13 and the mode register 14 so as to sequentially generate internal control signals. The internal control signals are supplied to the row address buffer 2, the row address decoder 3, the sense amplifiers 4, the column address buffer 5, the data controller 9, the latch circuit 10, the precharge circuit 16 and the data buffer 11. One of the internal control signals is called as "output enable signal OE", and is supplied to the data buffer 11. The internal control signals sequentially activate those circuits so as to write data bits into and read out the data bits from the memory cell array 1.

The external control signals CSB/RASB/CASB/WE are, by way of example, assumed to represent the command for activation. The control signal generator 15 firstly supplies the internal control signal to the row address buffer 2, and the external row address signal is stored in the row address buffer 2. The row address buffer 2 generates the row address predecoded signals, and supplies them to the row address decoder 3.

Subsequently, the control signal generator 15 supplies the internal control signal to the row address decoder 3 so that the row address decoder 3 decodes the row address predecoded signals for driving the word line specified by the row address signal. The memory cells connected to the selected word line put the data bits on the associated bit line pairs, and the read-out data bits form potential differences on the bit line pairs, respectively.

Subsequently, the control signal generator 15 supplies the internal control signal to the sense amplifiers 4 so that the sense amplifiers 4 rapidly increase the magnitude of potential differences on the bit line pairs. The increased potential differences return to the selected memory cells, and the data bits are refreshed.

Upon completion of the activation, the external control signals CSB/RASB/CASB/WE carry another command representative of a data read-out to the command decoder 13. The command decoder 13 interprets the command, and supplies the decoded signals to the control signal generator 15. The control signal generator 15 firstly supplies the internal control signal to the column address buffer 5. The external column address signal is latched by the column address buffer 5, and the column address predecoded signals are supplied to the column address decoder 6. The column address decoder 6 causes the column selector 7 to selectively connect the bit line pairs to the data lines 8, and the data controller 9 transfers the data bit or bits to the latch circuit 10 so as to temporarily store the data bit. The data bit is transferred from the latch circuit 10 to the data buffer 11. The data buffer 11 is enabled with the output enable signal OE, and outputs the output data signal Dout in response to the clock signal ICLKOE.

After the output data signal Dout is delivered from the data buffer 11, another command representative of a precharge is supplied to the command decoder 13. The command decoder 13 decodes the command, and instructs the control signal generator 15 to recover the internal control signal already supplied to the row address decoder 3 to the inactive level. The selected memory cells are disconnected from the bit line pairs.

Subsequently, the control signal generator 15 supplies the internal control signal to the precharge circuit 16 so that the precharge circuit 16 balances the bit lines at the precharge level. As a result, the prior art synchronous dynamic random access memory device becomes ready for the next access.

FIG. 2 illustrates the data buffer 11. The data buffer 11 includes an input circuit 11a and an output circuit 11b, and the input circuit 11a and the output circuit 11b are connected in parallel between the data line 18 and a data port 19. The output circuit 11b is hereinbelow detailed.

The output circuit 11b includes a NOR gate NR1, a NAND gate ND1, an inverter IV1, n-channel enhancement type switching transistors 11c/11d, data storage loops 11e and an output driver 11f. The data line is connected to one of the input nodes of the NOR gate NR1 and one of the input nodes of the NAND gate ND1, and the n-channel enhancement type switching transistors 11c/11d are connected between the NOR gate/NAND gate ND1 and the data storage loops 11e. The output enable signal OE is directly supplied to the other input node of the NAND gate ND1 and through the inverter IV1 to the other input node of the NOR gate NR1. For this reason, the NAND gate ND1 and the NOR gate NR1 are enabled with the output enable signal OE of the high level, and becomes responsive to the read-out data signal Sread. The n-channel enhancement type switching transistors 11c/11d are gated by the internal clock signal ICLKOE. While the internal clock signal ICLKOE is staying in the low level, the n-channel enhancement type switching transistors 11c/11d are turned off, and the data storage loops 11e are electrically isolated from the NOR gate NR1 and the NAND gate ND1. On the other hand, when the internal clock signal ICLKOE is changed to the high level, the n-channel enhancement type field effect transistors 11c/11d turn on, and a new read-out data bit is transferred from the NOR gate/the NAND gate NR1/ND1 through the data storage loops 11e to the output driver 11f. It is reasonable to supply the output enable signal OE to the NOR gate NR1 and the NAND gate ND1 located on the upstream side rather than the n-channel enhancement type field effect transistors 11c/11d gated by the internal clock signal ICLKOE, because the prior art synchronous dynamic random access memory device easily satisfies the data output hold time tOH and a data output high-impedance time tHZ.

The data storage loops 11e have an inverter/a NOR gate IV2/NR2 and an inverter/a NAND gate IV3/ND2, respectively, and the output node and the input node of each inverter IV2/IV3 are respectively connected to the input node and the output node of the NOR gate NR2 or the NAND gate ND2. The NOR gate/the NAND gate NR2/ND2 fix the potential level at the input nodes of the associated inverters IV2/IV3 to the opposite level at the output nodes of the inverters IV2/IV3, and maintain the read-out data bit until a new read-out data bit arrives at the input nodes of the inverters IV2/IV3.

While the internal power voltage is rising toward the predetermined level, the power-on signal PON is in the high level. The power-on signal PON is recovered to the low level when the internal power voltage reaches the predetermined level. The power-on signal PON is supplied to the other input node of the NOR gate NR2, and through an inverter IV4 to the other input node of the NAND gate ND2. For this reason, the NOR gate NR2 and the NAND gate ND2 are disabled with the power-on signal PON during the unstable potential rise of the internal power voltage, and inverters IV2/IV3 fix the output nodes thereof to the hgh level and the low level, respectively. However, after reaching the predetermined voltage, the power-on signal PON is recovered to the low level, and the NOR gate NR2 and the NAND gate ND2 are enabled with the inverted power-on signal PON.

FIG. 3 illustrates the circuit configuration of the output driver 11f. The output driver 11f includes a series combination of a p-channel enhancement type field effect transistor 11g and an n-channel enhancement type field effect transistor 11h. The series combination of the field effect transistors 11g/11h are connected between the power supply line Vdd and a ground line GND. The output node of the inverter IV2 and the output node of the inverter IV3 are respectively connected to the gate electrode of the p-channel enhancement type field effect transistor 11g and the gate electrode of the n-channel enhancement type field effect transistor 11h. For this reason, while the power-on signal PON is in the high level, the p-channel enhancement type field effect transistor 11g and the n-channel enhancement type field effect transistor 11h are turned off, and the output port 19 is isolated from both of the internal power supply line Vdd and the ground line GND. On the other hand, when the power-on signal PON is changed to the low level, inverters IV2/IV3 cause the p-channel enhancement type field effect transistors 11g and the n-channel enhancement type field effect transistor 11h to complementarily turn on and off so as to drive the output port 19.

Assuming now that the external power source starts to supply the external power voltage PW at time t1, the power source 17 raises the internal power voltage Vdd, and changes the power-on signal PON to the high level at time t2. The power-on signal PON is supplied to the NOR gate NR2 and the inverter IV4, and the NOR gate NR2 and the NAND gate ND2 are with the inverted power-on signal PON. The inverter IV2 fixes the output node thereof to the high level, and the inverter IV3 fixes the output node to the low level. As a result, both field effect transistors 11g/11h turn off, and the data port 19 is electrically isolated from both of the power supply line Vdd and the ground line GND. Thus, the data port 19 enters the high-impedance state HZ at time t3. The internal clock signal ICLKOE has been fixed to the low level before time t3, and the NOR gate NR2 and the NAND gate ND2 do not allow the inverters IV2/IV3 to change the potential level at the output nodes thereof. The internal power voltage reaches the predetermined level at time t4, and the power source 17 changes the power-on signal PON to the low level. Then, the NOR gate NR2 and the NAND gate ND2 are enabled, and the inverters IV2/IV3 becomes responsive to the read-out data signal Sread. As a result, the data port 19 becomes connectable to one of the power voltage line Vdd and the ground line GND depending upon the read-out data signal Sread.

The power source 17 is less reliable, and sometimes fails to change the power-on signal PON to the high level, because the internal power voltage is on the way to the predetermined level. In this situation, both of the NOR gate NR1 and the NAND gate ND1 are enabled, and the output driver 11f is in the low-impedance state at time t3 as shown in FIG. 5. The internal power voltage does not reach the predetermined level, and the data port 19 is connectable to the power supply line Vdd and the ground line GND. This results in the output circuit 11b unintentionally outputting the output data signal Dout.

SUMMARY OF THE INVENTION

It is therefore an important object of the present invention to provide a semiconductor synchronous memory device, which surely keeps a data port in the high-impedance state until the internal power voltage becomes stable.

It is also an important object of the present invention to provide a method for controlling the data port of the semiconductor synchronous memory device.

To accomplish the object, the present invention proposes to produce an internal control signal from an external control signal so as to force an output driver to enter the high-impedance state.

In accordance with one aspect of the present invention, there is provided a semiconductor synchronous memory device comprising a memory cell array including plural memory locations for storing pieces of data information, a data buffer connected to a data port, and having an output circuit for changing the data port between a high-impedance state, a first potential level representative of a selected piece of data information and a low potential level representative of another piece of data information, an addressing means selectively connecting the plural memory locations to the data buffer, a power source for generating an internal power voltage of a constant level from an external power voltage and a controlling means responsive to an external control signal so as to generates a first internal control signal forcing the output circuit to change the data port into the high-impedance state while the internal power voltage is rising toward the constant level.

In accordance with another aspect of the present invention, there is provided a method for controlling a semiconductor synchronous memory device comprising the steps of a) supplying an external control signal representative of entry into high-impedance state from an external signal source to a semiconductor synchronous memory device, b) starting to supply an external power voltage to the semiconductor synchronous memory device so that an internal power voltage starts to rise toward a constant level, c) recognizing the external control signal on the way to the constant level so that an output driver of the semiconductor synchronous memory device forces a data port to enter the high-impedance state and d) changing the data port from the high-impedance state to low-impedance state after the internal power voltage reaches the constant level.

BRIEF DESCRIPTION OF THE DRAWINGS

The features and advantages of the semiconductor synchronous memory device and the controlling method will be more clearly understood from the following description taken in conjunction with the accompanying drawings in which.

DESCRIPTION OF THE PREFERRED EMBODIMENT

Figure 1:
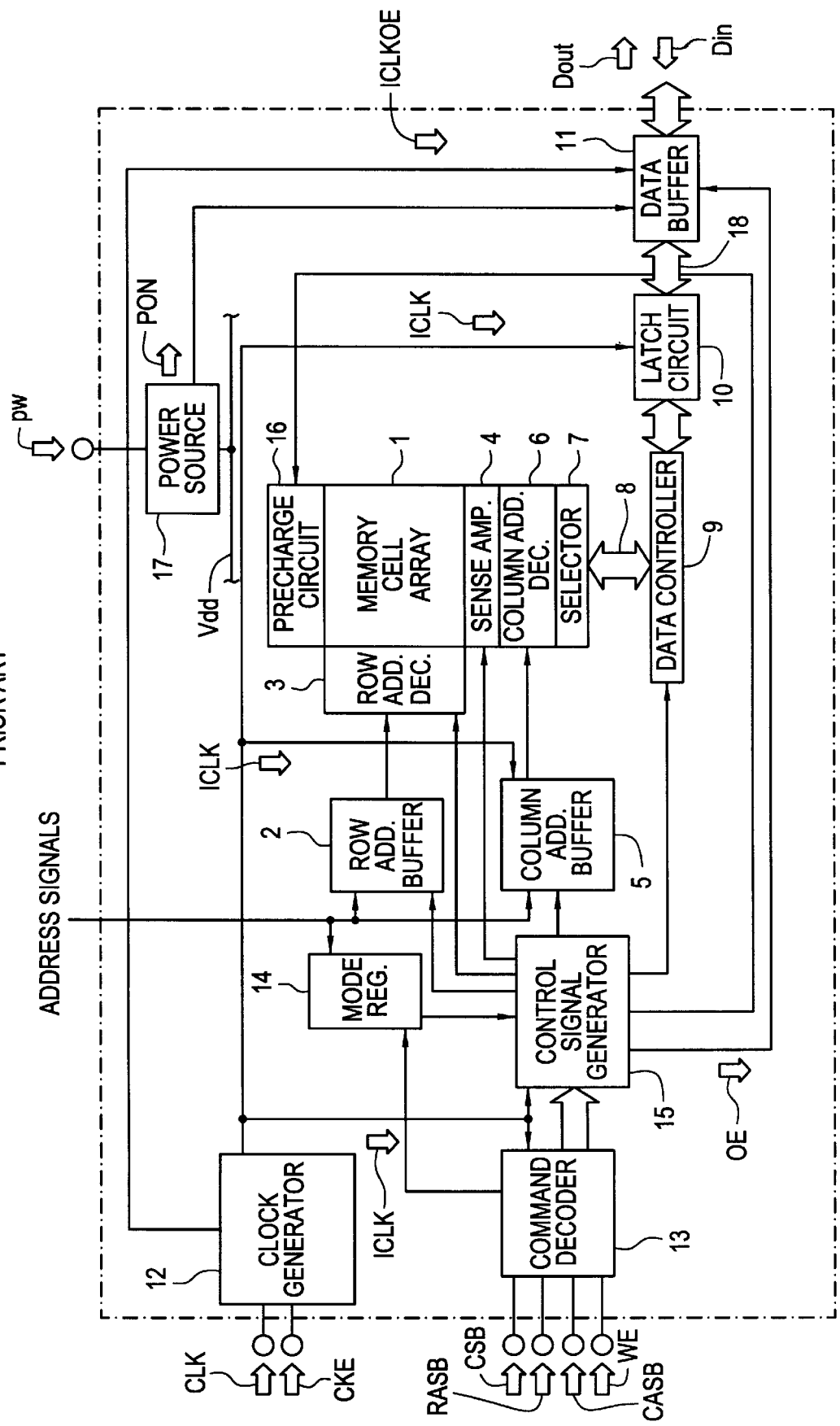
FIG. 1 is a block diagram showing the arrangement of component circuits incorporated in the prior art synchronous dynamic random access memory device.
Figure 2:
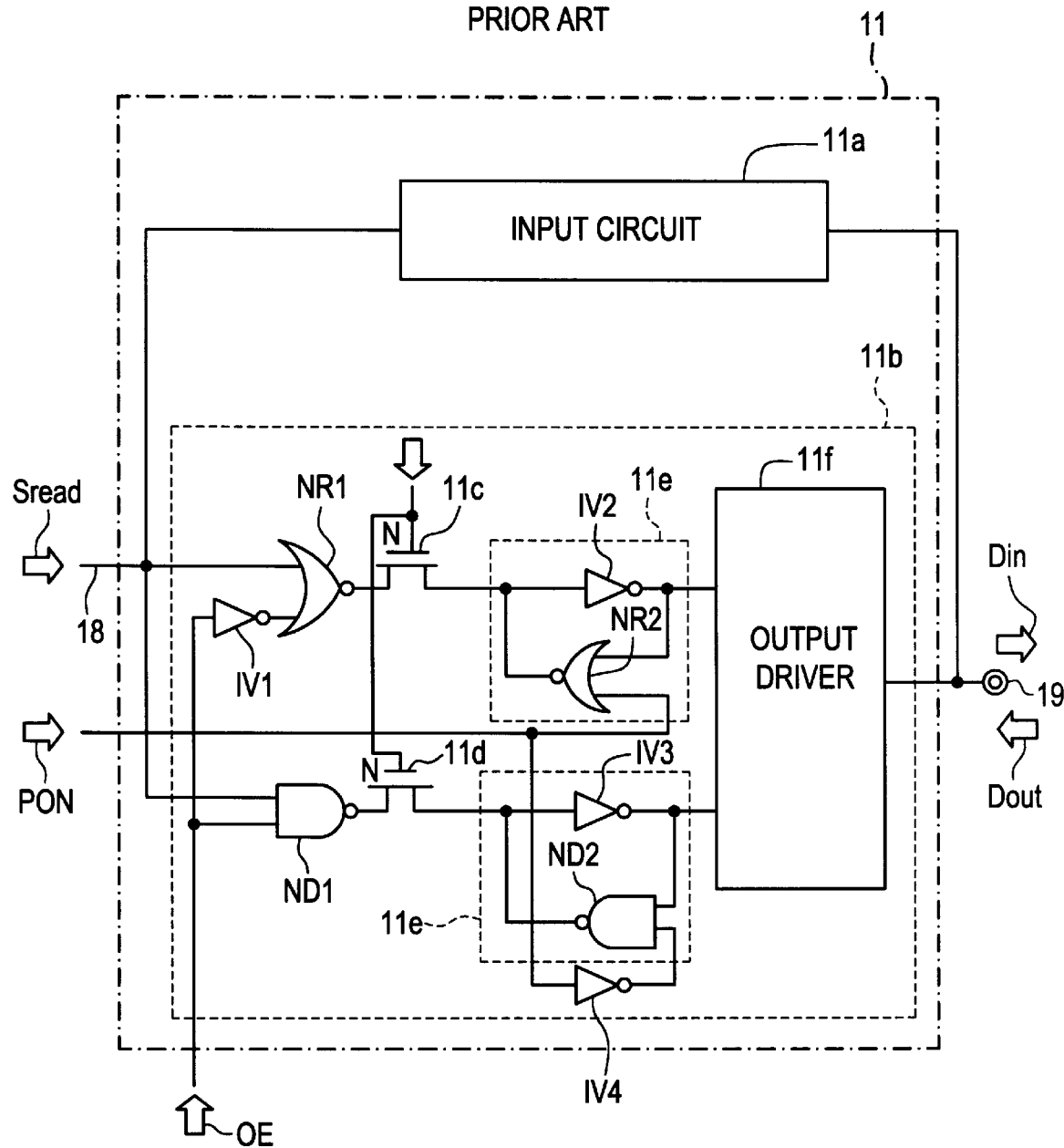
FIG. 2 is a circuit diagram showing the data buffer incorporated in the prior art synchronous dynamic random access memory device.
Figure 3:
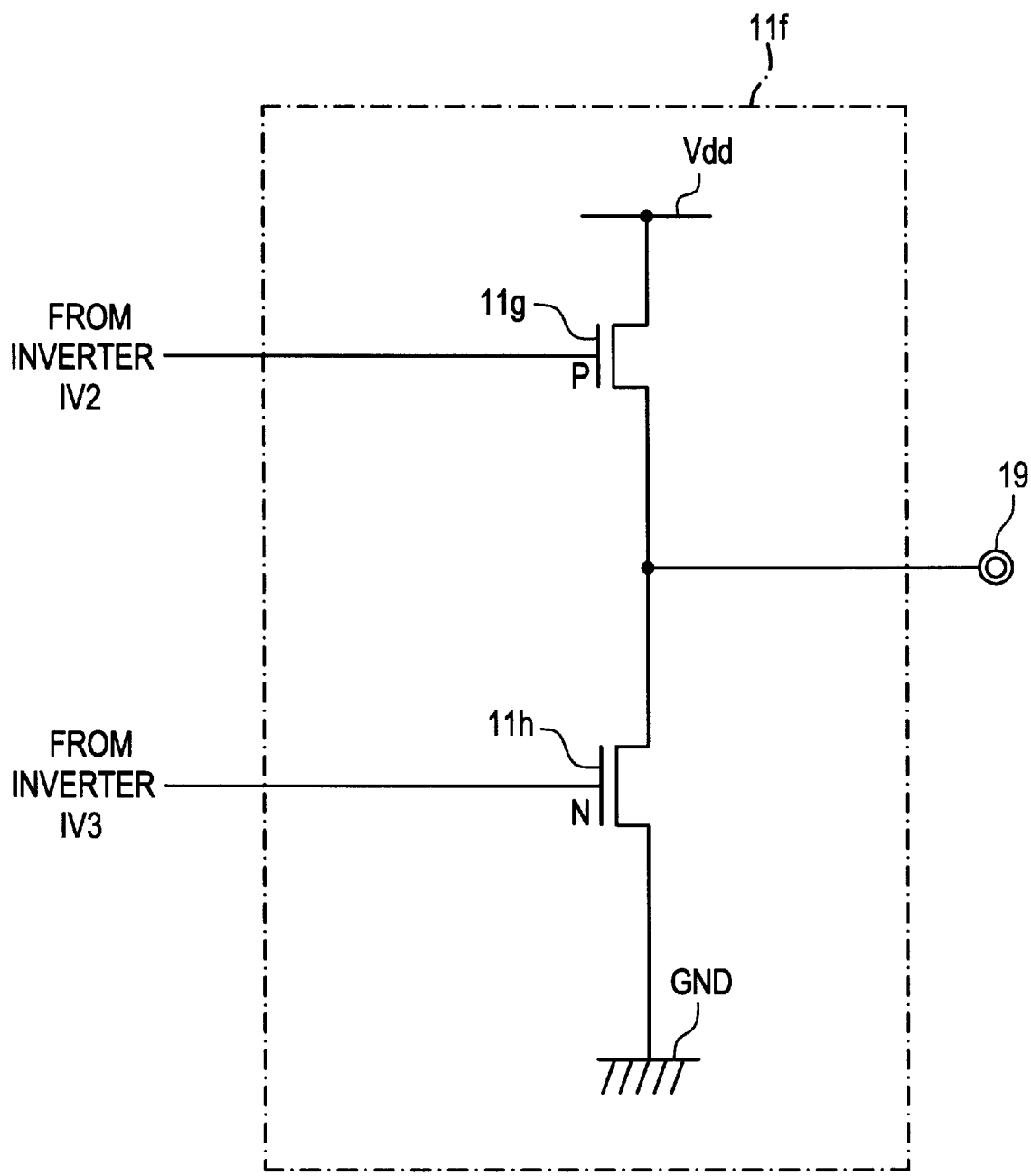
FIG. 3 is a circuit diagram showing the output driver incorporated in the output circuit.
Figure 4:
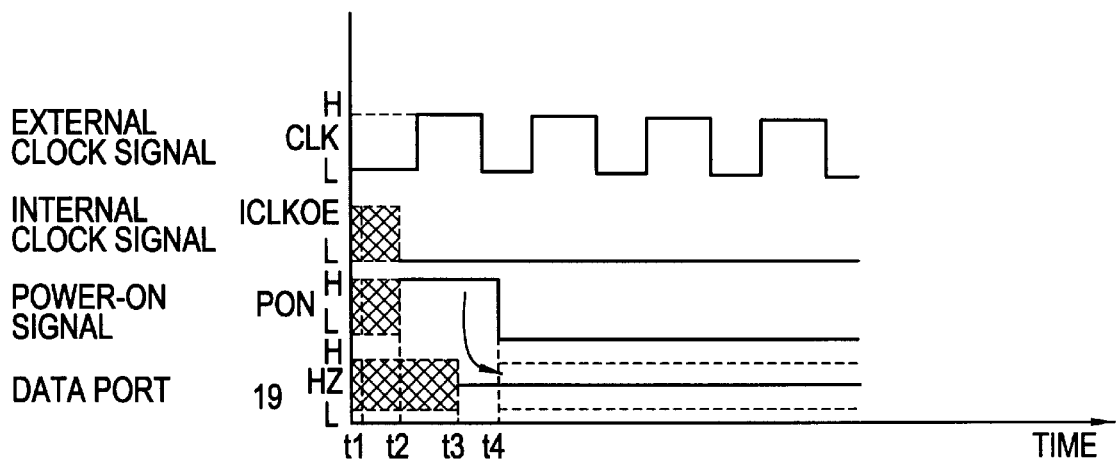
FIG. 4 is a graph showing the signal waveforms while the power source is rising the internal power voltage.
Figure 5:
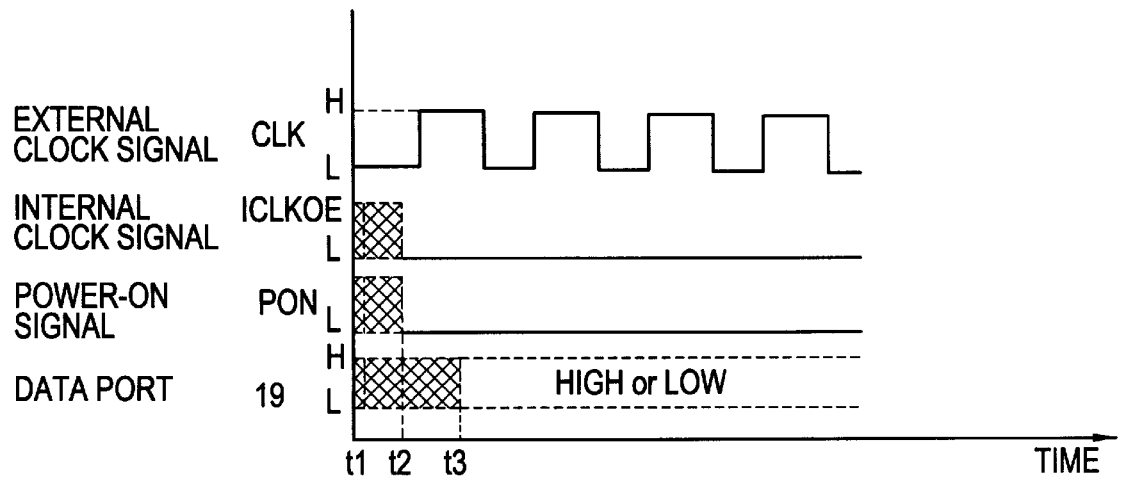
FIG. 5 is a graph showing the signal waveforms during the potential rise without generation of the power-on signal.
Figure 6:
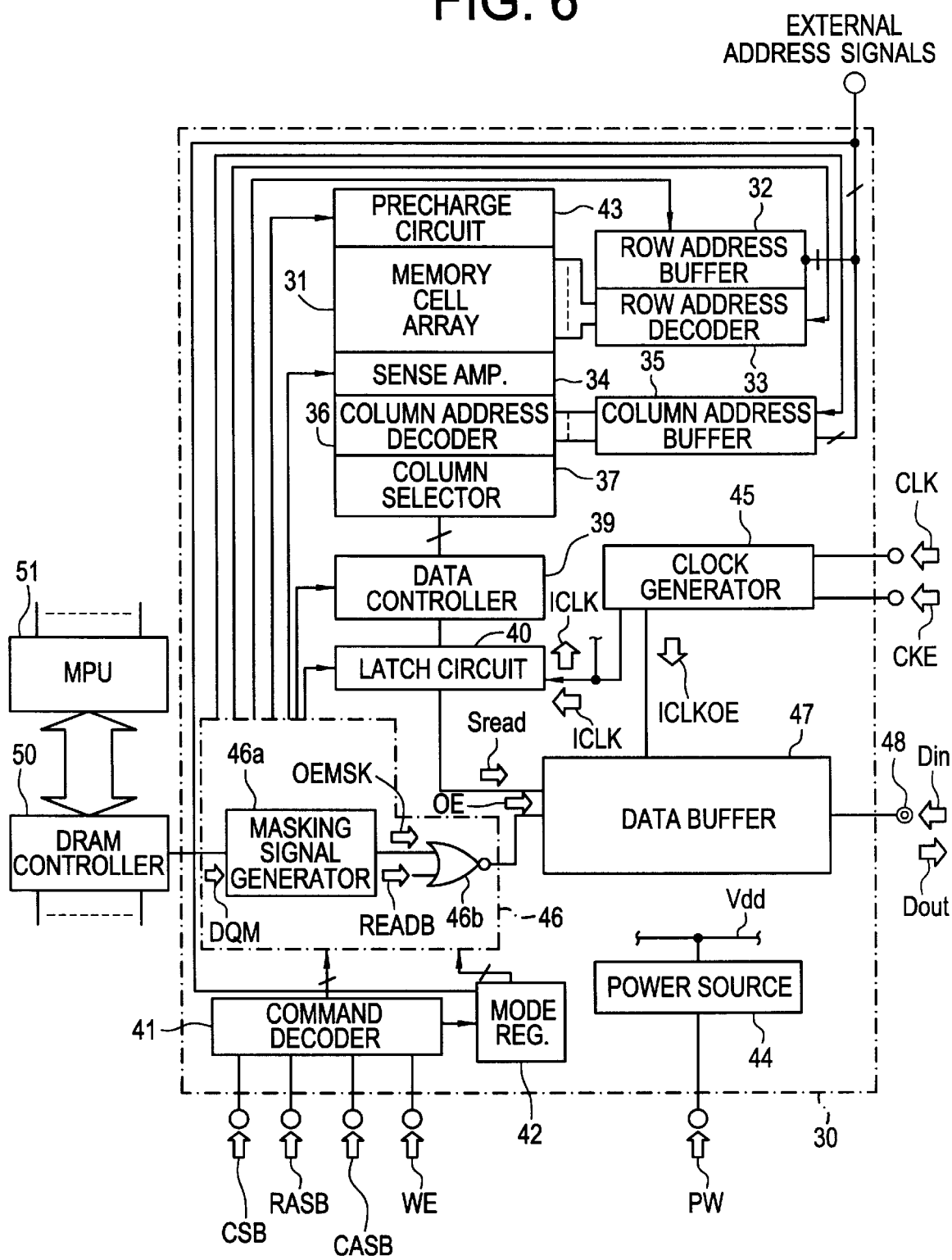
FIG. 6 is a circuit diagram showing an essential part of a synchronous dynamic random access memory device according to the present invention.

Referring to FIG. 6 of the drawings, a synchronous dynamic random access memory device embodying the present invention is fabricated on a semiconductor chip 30. A memory cell array 31, a row address buffer 32, a row address decoder 33, sense amplifiers 34, a column address buffer 35, a column address decoder 36, a column selector 37, a data controller 39, a latch circuit 40, a command decoder 41, a mode register 42 and a precharge circuit 43 are incorporated in the synchronous dynamic random access memory device. These component circuits 31/32/33/34/35/ 36/37/39/40/41/42/43 are similar to those of the prior art synchronous dynamic random access memory device, and, for this reason, are not described hereinbelow in detail.

The synchronous dynamic random access memory device further comprises a power source 44, a clock generator 45, a control signal generator 46 and a data buffer 47 connected to a data port 48. These component circuits 44/45/46/47 are different from those of the prior art synchronous dynamic random access memory device. The power source 44 generates an internal power voltage from an external power voltage PW, and distributes the internal power voltage through a power supply line Vdd to other component circuits. However, the power-on signal PON is not supplied to the data buffer 47. An external clock signal CLK and a clock enable signal CKE are supplied to the clock generator 45. The clock enable signal CKE enables the clock generator 45, and the clock generator 45 produces internal clock signals ICLK/ICLKOE. The internal clock signal ICLK is distributed to selected component circuits as similar to that of the internal clock signal ICLK, and the internal clock signal ICKLOE is supplied to the data buffer 47. While the internal power voltage is rising toward the predetermined level, the clock generator 45 keeps the internal clock signal ICLKOE at the high level.

The control signal generator 46 similarly generates the internal control signals except the output enable signal OE, and selectively supplies the internal control signals to the selected component circuits as shown. The control signal generator 46 includes a masking signal generator 46a and a NOR gate 46b. The other feature of the control signal generator 46 is similar to those of the control signal generator 15, and only the masking signal generator 46a and the NOR gate 46b are described in detail.

The masking signal generator 46a is connected to a dynamic random access memory controller 50, which is abbreviated as "DRAM controller" in FIG. 6. The dynamic random access memory controller 50 is under the control of a microprocessor 51, and generates a data masking signal DMQ and the other external control signals CSB/RASB/ CASB/WE. The data masking signal DMQ makes the data port 48 inactive, and the data buffer 11 does not respond to an input data signal Din and an output data signal Dout. Thus, the data masking signal DMQ masks the data port 48. When the external power source (not shown) starts to supply the external power voltage PW to the power source 44, the dynamic random access memory controller 50 supplies the data masking signal DMQ to the masking signal generator 46a, and the masking signal generator 46a changes an internal masking signal OEMSK to the high level. The internal masking signal OEMSK is supplied to one of the input nodes of the NOR gate 46b, and a data read signal READB is supplied to the other input node of the NOR gate 46b. Another logic gate (not shown) of the control signal generator 46 changes the data read signal READB between the active low level and the inactive high level. Thus, the masking signal generator 46a disables the NOR gate 46b with the internal masking signal OEMSK during the potential rise of the internal power voltage, and, accordingly, the NOR gate 46b keeps the output node at the low level regardless of the data read signal READB. The potential level at the output node of the NOR gate 46b serves as an output enable signal OE.

Figure 7:
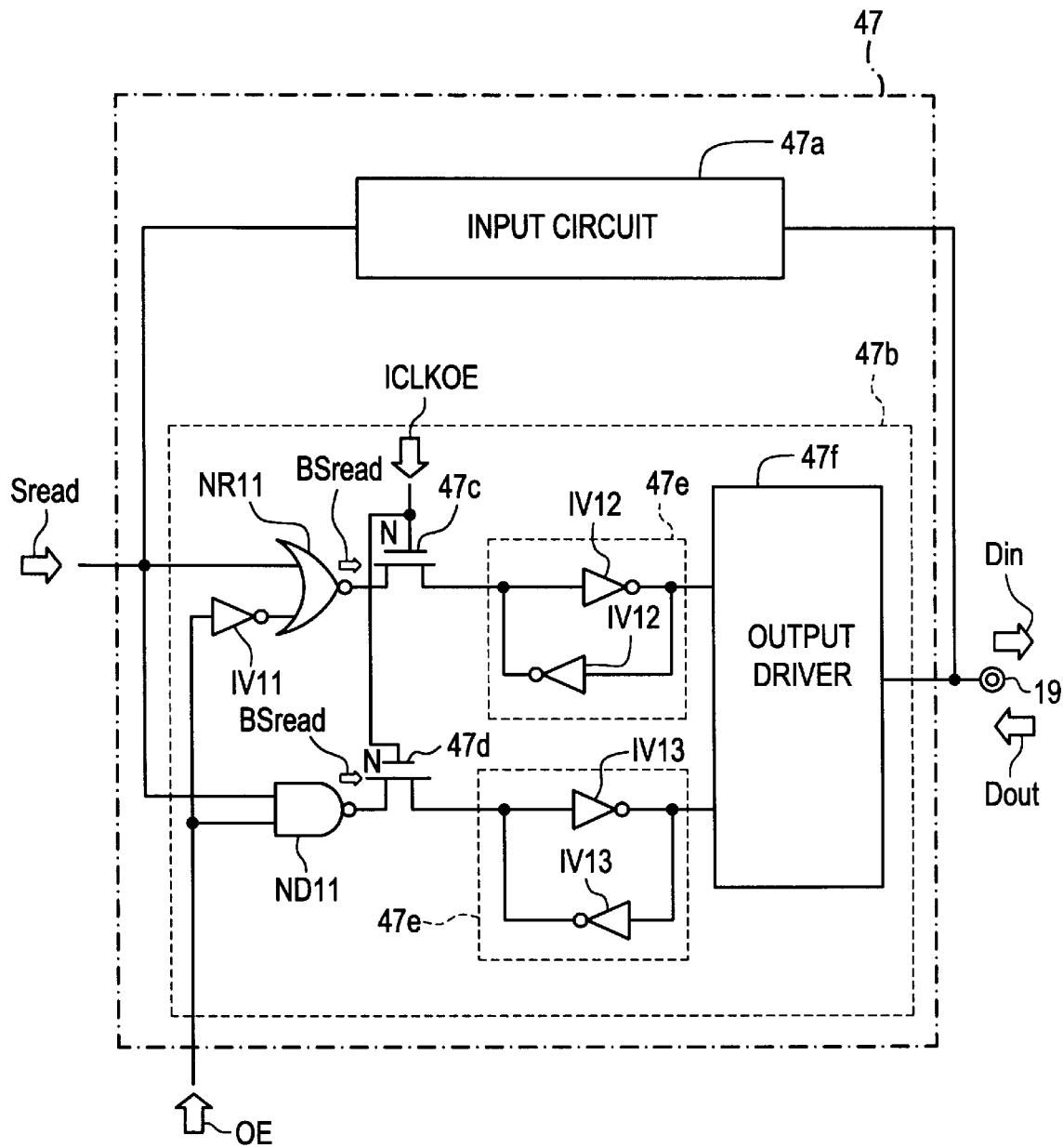
FIG. 7 is a circuit diagram showing a data buffer incorporated in the synchronous dynamic random access memory device.

The data buffer 47 is illustrated in FIG. 7, and includes an input circuit 47a and an output circuit 47b connected in parallel between the latch circuit 40 and the data port 48. The output circuit 47b includes a NOR gate NR11, a NAND gate ND11, an inverter IV11, n-channel enhancement type switching transistors 47c/47d, data storage loops 47e and an output driver 47f. The latch circuit 40 is connected to one of the input nodes of the NOR gate NR11 and one of the input nodes of the NAND gate ND11, and the n-channel enhancement type switching transistors 47c/47d are connected between the NOR gate/NAND gate NR11/ND11 and the data storage loops 47e. The output enable signal OE is directly supplied to the other input node of the NAND gate ND11 and through the inverter IV11 to the other input node of the NOR gate NR11. For this reason, the NAND gate ND11 and the NOR gate NR11 are enabled with the output enable signal OE of the high level, and becomes responsive to the read-out data signal Sread. The n-channel enhancement type switching transistors 47c/47d are gated by the internal clock signal ICLKOE. While the internal clock signal ICLKOE is staying in the low level, the n-channel enhancement type switching transistors 47c/47d are turned off, and the data storage loops 47e are electrically isolated from the NOR gate NR11 and the NAND gate NR11. On the other hand, when the internal clock signal ICLKOE is changed to the high level, the n-channel enhancement type field effect transistors 47c/47d turn on, and a new read-out data bit is transferred from the NOR gate/the NAND gate NR11/ND11 through the data storage loops 47e to the output driver 47f.

The data storage loops 11e have a pair of inverters IV12 and a pair of inverters IV13, respectively, and the output node and the input node of one of the inverters IV12/IV13 of the pair are respectively connected to the input node and the output node of the other inverter IV12/IV13 of the same pair.

Figure 8:
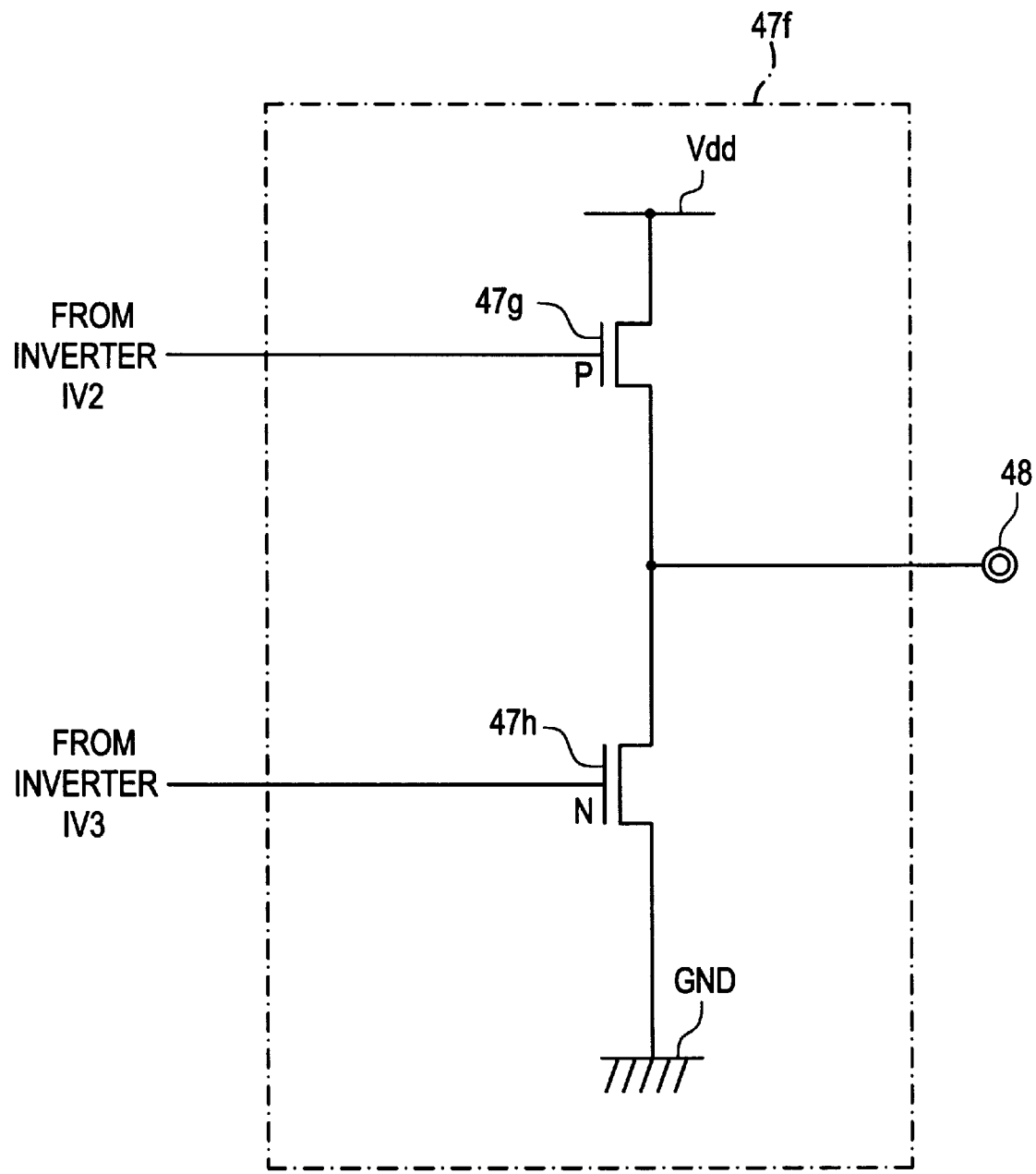
FIG. 8 is a circuit diagram showing an output driver incorporated in the data buffer.

FIG. 8 illustrates the circuit configuration of the output driver 47f. The output driver 47f includes a series combination of a p-channel enhancement type field effect transistor 47g and an n-channel enhancement type field effect transistor 47h. The series combination of the field effect transistors 47g/47h are connected between the power supply line Vdd and a ground line GND. The output node of the inverter IV12 and the output node of the inverter IV13 are respectively connected to the gate electrode of the p-channel enhancement type field effect transistor 47g and the gate electrode of the n-channel enhancement type field effect transistor 47h.

As described hereinbefore, while the power source 44 is raising the internal power voltage Vdd toward a predetermined constant level, the clock generator 45 keeps the internal clock signal ICLKOE at the high level, and the n-channel enhancement type field effect transistors 47c/47d are turned on. The NOR gate 46b keeps the output enable signal OE at the low level during the potential rise toward the predetermined constant level, and the output enable signal OE causes the NAND gate ND11 and the NOR gate NR11 to fix the output node thereof to the high level and the output node to the low level, respectively. The high level and the low level are transferred from the NOR gate NR11 and the NAND gate ND11 through the n-channel enhancement type switching transistors 47c/47d to the inverters IV12/ IV13, and the inverters IV12/IV13 supply the high level and the low level to the gate electrode of the p-channel enhancement type field effect transistor 47g and the gate electrode of the n-channel enhancement type field effect transistor 47h, respectively. The p-channel enhancement type field effect transistor 47g and the n-channel enhancement type field effect transistor 47h are turned off, and the data port 48 enters the high-impedance state.

Description is hereinbelow made on the circuit behavior of the synchronous dynamic random access memory device with reference to FIGS. 6 to 10. In FIG. 7, the signals CLK/DMQ/OEMSK/ICLKOE/DQ are undefined in netted periods. The external clock signal CLK is continuously supplied to the clock generator 45, and the dynamic random access memory controller 50 changes the data masking signal DMQ to the high level before time t30.

Figure 9:
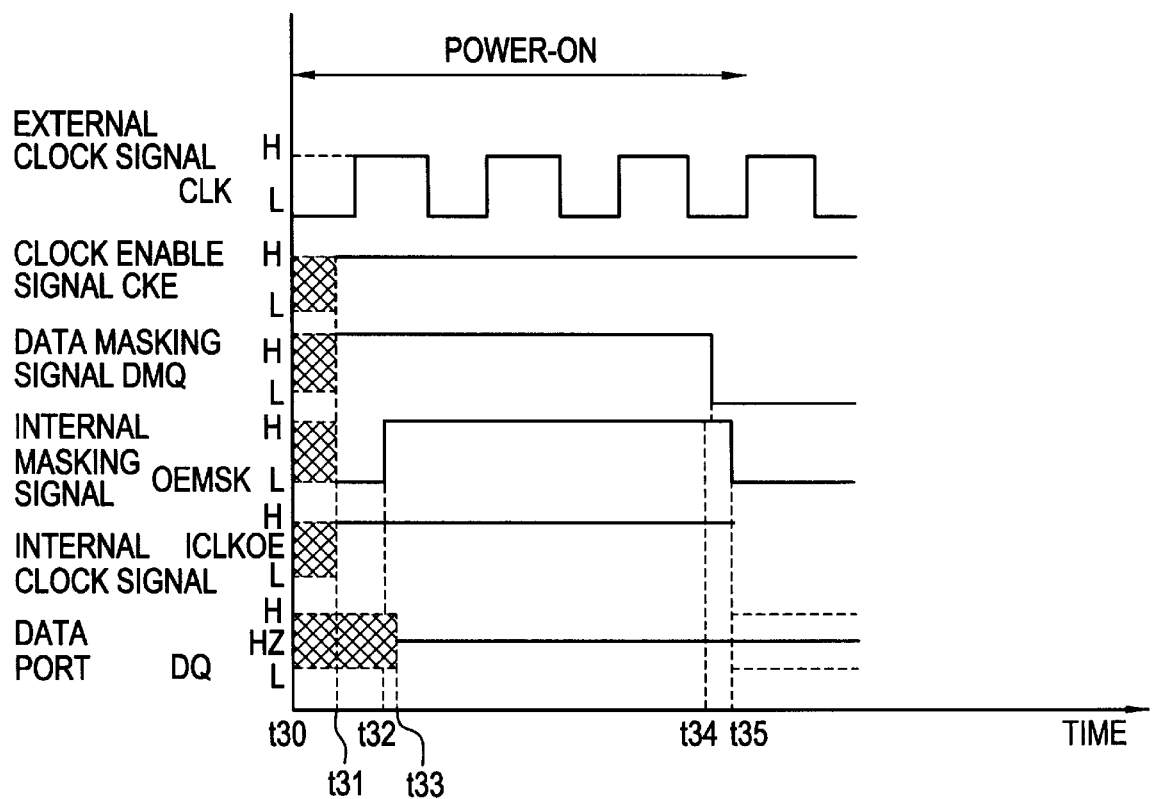
FIG. 9 is a graph showing signal waveforms observed in the synchronous dynamic random access memory device during a potential rise of an internal power voltage.
Figure 10:
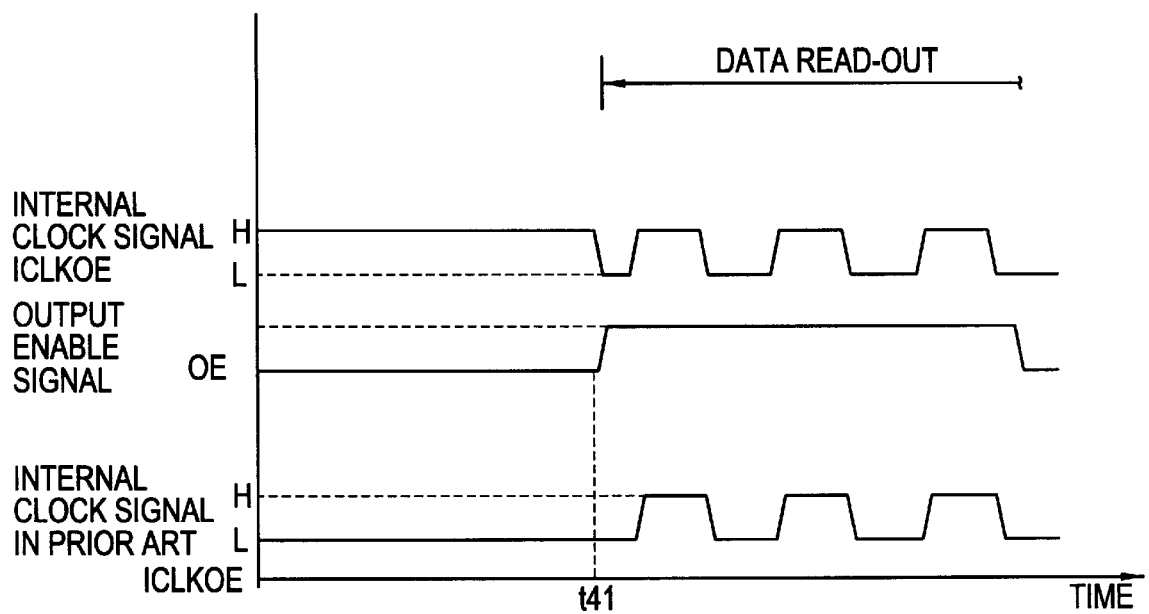
FIG. 10 is a graph showing signal waveforms observed in the synchronous dynamic random access memory device during a data read-out.

Assuming now that the external power source starts to supply the external power voltage PW to the power source 44 at time t30, the power source 44 gradually raises the internal power voltage on the power supply line Vdd. While the internal power voltage is rising toward the predetermined constant level, the synchronous dynamic random access memory device passes a power-on period, and causes the data port 48 to enter the high impedance state as shown in FIG. 9.

First, the clock generator 45 and the masking signal generator 46a recognize the potential level of the clock enable signal CKE and the data masking signal DMQ at time t31, and the clock generator 45 immediately changes the internal clock signal ICLKOE to the high level. Subsequently, the masking signal generator 46a changes the internal masking signal OEMSK to the high level at time t32.

The internal clock signal ICLKOE of the high level causes the n-channel enhancement type switching transistor 47c to turn on, and the output node of the NOR gate NR11 and the output node of the NAND gate ND11 are respectively connected through the n-channel enhancement type switching transistor 47c/47d and the inverters IV12/IV13 to the gate electrode of the p-channel enhancement type field effect transistor 47g and the gate electrode of the n-channel enhancement type field effect transistor 47h.

The internal masking signal OEMSK of the high level disables the NOR gate 46b, and the NOR gate 46b fixes the output enable signal OE to the low level. The output enable signal OE of the low level disables the NOR gate NR11 and the NAND gate ND11, and the NOR gate NR11 and the NAND gate ND11 fix the output nodes thereof to the low level and the high level regardless of the potential level at the other input nodes. The low level and the high level are transferred from the NOR gate NR11 and the NAND gate ND11 through the n-channel enhancement type switching transistors 47c/47d and to the inverters IV12/IV13, and the inverters IV12/IV13 fix the output nodes thereof to the high level and the low level, respectively. The inverters IV12/IV13 supply the high level and the low level to the gate electrode of the p-channel enhancement type field effect transistor 47g and the gate electrode of the n-channel enhancement type field effect transistor 47h, respectively, and the output driver 47f enters the high-impedance state. For this reason, the output driver 47f never outputs any undefined output data signal to the outside thereof.

After the internal power voltage reaches the predetermined constant level, the data masking signal DMQ is changed to the low level at time t34, and, accordingly, the masking signal generator 46a recovers the internal masking signal OEMSK to the low level at time t35. The NOR gate is enabled with the internal masking signal OEMSK of the low level, and becomes responsive to a data read-out request signal READB. The synchronous dynamic random access memory device enters a standby mode.

After the entry into the standby mode, the dynamic random access memory controller 50 requests the synchronous dynamic random access memory device to read out a data bit with a command. The command is decoded by the command decoder 41, and the control signal generator 15 changes the data read-out request signal READB to the active low level, and the NOR gate 46b changes the output enable signal OE to the active high level at time t41 (see FIG. 10). The NOR gate NR11 and the NAND gate ND11 are enabled with the output enable signal OE, and becomes responsive to the read-out data signal Sread.

The internal clock signal ICLKOE is periodically changed between the high level and the low level, and the n-channel enhancement type switching transistors 47c/47d are repeatedly changed between the on-state and the off-state. While the internal clock signal ICLKOE is in the high level, the n-channel enhancement type switching transistors 47c/47d transfer the inverted read-out data signal BSread to the inverters IV12/IV13, and the inverters IV12/IV13 cause the output driver 47f to change the output data signal Dout. On the other hand, when the internal clock signal ICLKOE is changed to the low level, the n-channel enhancement type switching transistors 47c/47d turn off, and the read-out data bit is stored in the data storage loops 47e.

In the preferred embodiment, the row address buffer 32, the row address decoder 33, the sense amplifiers 34, column address buffer 35, the column address decoder 36, the column selector 37, the data controller 39, the latch circuit 40 and the precharge circuit 43 as a whole constitute an addressing means. The command decoder 41, the mode register 42, the control signal generator 46 and the clock generator 45 form in combination a controlling means.

As will be appreciated from the foregoing description, the dynamic random access memory controller 50 forces the control signal generator 46 to fix the internal masking signal OEMSK and the output enable signal OE to the active high level and the inactive low level, respectively, and causes the output driver 47e to enter the high-impedance state. For this reason, even if the power source fails to change the power-on signal to the active high level, the output driver 47e surely enters into the high-impedance state.

Although a particular embodiment of the present invention has been shown and described, it will be apparent to those skilled in the art that various changes and modifications may be made without departing from the spirit and scope of the present invention.

What is claimed is:

1. A semiconductor synchronous memory device comprising:

a memory cell array including plural memory locations for storing pieces of data information;

a data buffer connected to a data port, and having an output circuit for changing said data port between a high-impedance state, a first potential level representative of a selected piece of data information and a low potential level representative of another piece of data information;

an addressing means selectively connecting said plural memory locations to said data buffer;

a power source for generating an internal power voltage of a constant level from an external power voltage; and a controlling means responsive to an external control signal so as to generate a first internal control signal forcing said output circuit to change said data port to said high-impedance state while said internal power voltage is rising toward said constant level.

2. The semiconductor synchronous memory device as set forth in claim 1, in which said external control signal is supplied from an external controller supervised by a data processing unit.

3. The semiconductor synchronous memory device as set forth in claim 2, in which said plural memory locations are dynamic random access memory cells, and said external controller is a dynamic random access memory controller.

4. The semiconductor synchronous memory device as set forth in claim 1, in which said controlling means is further responsive to an external command so as to sequentially supply second internal control signals to said addressing means and said data buffer for controlling a data transfer between said memory cell array and said data buffer after said internal power voltage reaches said constant level.

5. The semiconductor synchronous memory device as set forth in claim 4, in which said controlling means includes
 a command decoder responsive to said external command for generating decoded signals, and
 a control signal generator having a first signal sub-generator responsive to said external control signal for generating said first internal control signal, a second signal sub-generator responsive to said external command for generating said second internal control signals and a first logic circuit supplied with said first internal control signal and one of said second internal control signals for generating an enable signal supplied to said output circuit.

6. The semiconductor synchronous memory device as set forth in claim 5, in which said external control signal is representative of a masking operation on said data port, and said first internal control signal renders said first logic circuit disable to respond to said one of said second internal control signals.

7. The semiconductor synchronous memory device as set forth in claim 6, in which said first internal control signal is in an active high level, and said first logic circuit is a NOR gate.

8. The semiconductor synchronous memory device as set forth in claim 5, in which said controlling means further includes a clock generator responsive to an external clock enable signal for generating an internal clock signal, and said output circuit includes
 a second logic circuit supplied with said enable signal from said first logic circuit and a first read-out data signal for producing a second read-out data signal,
 a transfer transistor connected to an output node of said second logic circuit and responsive to said internal clock signal so as to be changed between on-state and off-state,
 a third logic circuit connected to said transfer transistor for producing a third read-out data signal from said second read-out data signal, and
 an output driver connected between said third logic circuit and said data port.

9. The semiconductor synchronous memory device as set forth 8, in which said enable signal is changed between an active high level and an inactive low level, and said first logic circuit, said second logic circuit and said third logic circuit are a NOR gate, a NAND gate and an inverter, respectively.

10. A method for controlling a semiconductor synchronous memory device, comprising the steps of:
 a) supplying an external control signal representative of entry into high-impedance state from an external signal source to a semiconductor synchronous memory device;
 b) starting to supply an external power voltage to said semiconductor synchronous memory device so that an internal power voltage starts to rise toward a constant level;
 c) recognizing said external control signal while said internal power voltage is on the way to said constant level so that an output driver of said semiconductor synchronous memory device forces a data port to enter said high-impedance state; and
 d) changing said data port from said high-impedance state to low-impedance state after said internal power voltage reaches said constant level.

11. The method as set forth in claim 10, further comprising the step of e) responding an external command for selectively reading out a piece of data information from a memory cell array of said semiconductor synchronous memory device to said data port.

12. A semiconductor synchronous memory device comprising:
 a memory cell array including plural memory locations for storing pieces of data information;
 a data buffer connected to a data port, and having an output circuit for changing said data port between a high-impedance state, a first potential level representative of a selected piece of data information and a low potential level representative of another piece of data information;
 an addressing circuit selectively connecting said plural memory locations to said data buffer;
 a power source for generating an internal power voltage of a constant level from an external power voltage; and
 a controlling circuit responsive to an external control signal so as to generate a first internal control signal forcing said output circuit to change said data port to said high-impedance state while said internal power voltage is rising toward said constant level.

13. The semiconductor synchronous memory device as set forth in claim 12, in which said controlling circuit is further responsive to an external command so as to sequentially supply second internal control signals to said addressing circuit and said data buffer for controlling a data transfer between memory cell array and said data buffer after said internal power voltage reaches said constant level.

14. The semiconductor synchronous memory device as set forth in claim 13, in which said controlling circuit includes
 a command decoder responsive to said external command for generating decoded signals, and
 a control signal generator having a first signal sub-generator responsive to said external control signal for generating said first internal control signal, a second signal sub-generator responsive to said external command for generating said second internal control signals and a first logic circuit supplied with said first internal control signal and one of said second internal control signals for generating an enable signal supplied to said output circuit.

* * * * *